(12) United States Patent
Kuo et al.

(10) Patent No.: US 6,359,513 B1
(45) Date of Patent: Mar. 19, 2002

(54) CMOS POWER AMPLIFIER WITH REDUCED HARMONICS AND IMPROVED EFFICIENCY

(75) Inventors: Timothy C. Kuo, Milpitas; Bruce B. Lusignan, Pebble Beach, both of CA (US)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/774,775

(22) Filed: Jan. 31, 2001

(51) Int. Cl.[7] .................................................. H03F 3/26
(52) U.S. Cl. .......................... 330/276; 330/264; 330/302
(58) Field of Search ................................... 330/264, 269, 330/276, 302; 333/12, 167, 202

(56) References Cited

U.S. PATENT DOCUMENTS

| | | | | |
|---|---|---|---|---|
| 3,769,586 A | * | 10/1973 | Shapiro et al. | 325/157 |
| 4,097,814 A | * | 6/1978 | Cohn | 330/286 |
| 4,345,502 A | * | 8/1982 | Jahns | 84/1.21 |
| 4,491,697 A | * | 1/1985 | Tanaka et al. | 179/111 E |
| 5,498,997 A | * | 3/1996 | Schiebold | 330/277 |

OTHER PUBLICATIONS

"High Efficiency Power Amplifier for Microwave and Millimeter Frequencies" by William S. Kopp and Sam D. Pritchett, published in the IEEE MTT Symposium Digest, Jan. 1989, pp. 857–858.

"A New High Efficiency Power Amplifier for Modulated Waves" by W. H. Doherty, in the Proceedings of the Institute of Radio Engineers, vol. 24, No. 9, published in Sep. 1936.

* cited by examiner

Primary Examiner—Robert Pascal
Assistant Examiner—Henry Choe
(74) Attorney, Agent, or Firm—Theodorus N. Mak

(57) ABSTRACT

A CMOS Class F amplifier uses a differential input to eliminate even-order harmonics, thereby avoiding the need for circuits that are tuned to the second harmonic. This also minimizes the sensitivity of the design to changes in the second harmonic frequency and/or the particular component values selected for the tuned circuit. Third-order harmonics are reduced by controlling the phase relationship between the differential inputs. Additional efficiency is achieved by dynamically controlling the impedance of the amplifier as a function of output power level.

19 Claims, 2 Drawing Sheets

to the field of electronics, and in particular to a power amplifier for use in a CMOS device, such as a wireless transmitter.

CMOS POWER AMPLIFIER WITH REDUCED HARMONICS AND IMPROVED EFFICIENCY

BACKGROUND OF THE INVENTION

1. Field of the Invention

This invention relates to the field of electronics, and in particular to a power amplifier for use in a CMOS device, such as a wireless transmitter.

2. Description of Related Art

CMOS technology is commonly used for devices that require minimal power consumption, such as handheld telephones. Power amplifiers, such as used in the output stage of a wireless transmitter, however, are commonly fabricated with GaAs, Bipolar, or PHEMT technologies. As CMOS technology advances, it is becoming an attractive alternative for use in power amplifiers, based on its small feature sizes, low cost, and relatively high efficiency (low power loss). Because CMOS transistors are small and the cost of fabrication is low, complex designs that may not be economically feasible in other technologies are often quite feasible in CMOS.

FIG. 1 illustrates an example prior art power amplifier 100, commonly referred to as a Class F power amplifier. "HIGH EFFICIENCY POWER AMPLIFIER FOR MICROWAVE AND MILLIMETER FREQUENCIES" by William S. Kopp and Sam D. Pritchett, published in the IEEE MTT Symposium Digest, 1989, pp. 857–858, presents the principles of a Class F power amplifier, and is incorporated by reference herein. In a preferred embodiment, the transmission line T is tuned to short even-order harmonics, and a match network Co, Lo, CL is designed to match the load RL, so as to pass the fundamental frequency and attenuate the third-order harmonics. The capacitor CL, being parallel to RL, reduces the impedance associated with the load RL, while Lo cancels any remaining reactive impedance seen by the transistor. The signal is AC coupled through the capacitor Co.

The conventional Class F power amplifier substantially attenuates the even harmonics, via the transmission line T, and the third harmonic via the match network Co, Lo, CL, but the attenuation provided for the third harmonic is often insufficient for some applications. One of the reasons that the third harmonic remains at a high level is that, with a quarter wave transmission line T to cancel the even order harmonics, the impedance of the line T is minimum with respect to the second harmonic, but maximum with respect to the third harmonic. Therefore, third harmonics actually increase at the drain of the transistor M1, and, even with the match-filtering, third-order harmonics at the output of the amplifier can still be high. Also, the precise tuning of the transmission line T to correspond to the second-order harmonics can affect the attenuation that is achievable for the even-order harmonics. Improved attenuation of harmonics properly shapes the output waveform, and also results in higher efficiencies, as less power is wasted propagating unwanted harmonics.

Efficiency enhancement over a wide range of power is essential for today's wireless applications, because mobile terminals do not usually transmit at maximum output power. A high energy efficiency results in longer battery-life, reduces the requirements for heat dissipation, and so on.

BRIEF SUMMARY OF THE INVENTION

It is an object of this invention to reduce the harmonics produced in a Class F amplifier. It is another object of this invention to increase the efficiency of a Class F amplifier. It is a further object of this invention to provide the reduced harmonics and increased efficiency in a CMOS embodiment of a Class F amplifier. It is a further object of this invention to provide increased efficiency across a wide range of power output from a Class F amplifier.

These objects and others are achieved by providing a CMOS Class F amplifier that uses a differential input to eliminate even-order harmonics, thereby avoiding the need for circuits that are tuned to the second harmonic. This also minimizes the sensitivity of the design to changes in the second harmonic frequency and/or the particular component values selected for the tuned circuit. Third-order harmonics are reduced by controlling the phase relationship between the differential inputs. Additional efficiency is achieved by dynamically controlling the impedance of the amplifier as a function of output power level.

BRIEF DESCRIPTION OF THE DRAWINGS

The invention is explained in further detail, and by way of example, with reference to the accompanying drawings wherein.

Throughout the drawings, the same reference numerals or characters indicate similar or corresponding features or functions.

DETAILED DESCRIPTION OF THE INVENTION

Figure 1:
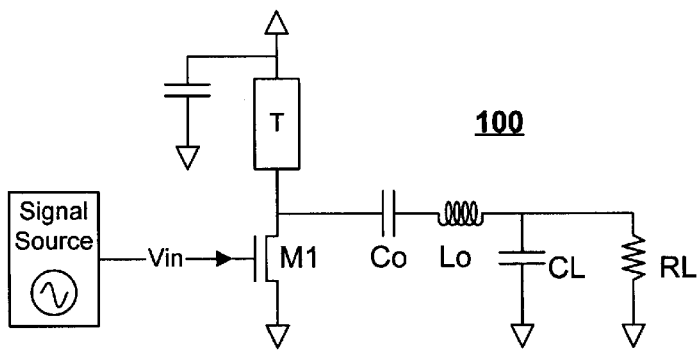
FIG. 1 illustrates an example schematic of a prior art Class F power amplifier.
Figure 2:
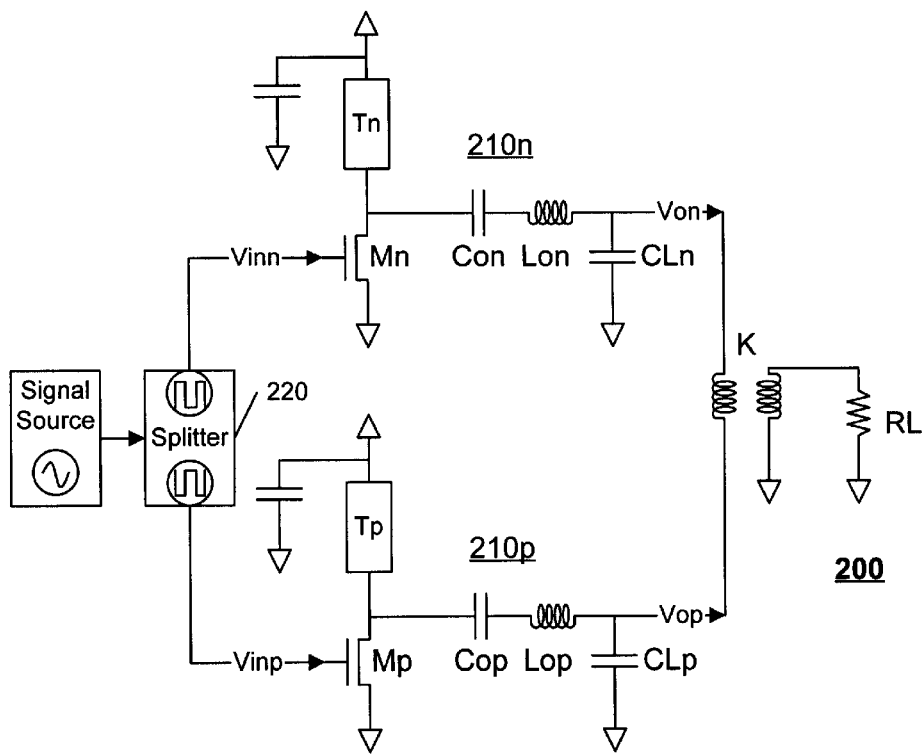
FIG. 2 illustrates an example schematic of a CMOS Class F power amplifier in accordance with this invention.

FIG. 2 illustrates an example schematic of a CMOS Class F power amplifier 200 in accordance with this invention. As illustrated, the input signal is split into differential input signals Vinn and Vinp, and each of the input signals Vinn and Vinp are provided to a corresponding power amplifier stage 210n, 210p. The output Von, Vop of each stage 210n, 210p feed the primary coil of an output transformer K, and the secondary coil of the output transformer K feeds the load RL.

Because the output signals Von, Vop are out of phase with each other, even-order harmonics are eliminated at the transformer K, thereby eliminating the need to precisely tune the transmission networks Tn, Tp to the second harmonic frequency and/or thereby minimizing the dependency of the even-order attenuation on the component values in the transmission networks Tn, Tp. Because the differential input provides for a cancellation of the even harmonics, the transmission lines Tn, Tp need not be tuned to the second harmonic, thereby avoiding the dissipation of power that is caused by the effective shorting of the second harmonic to ground in a conventional Class F amplifier.

Figure 3:
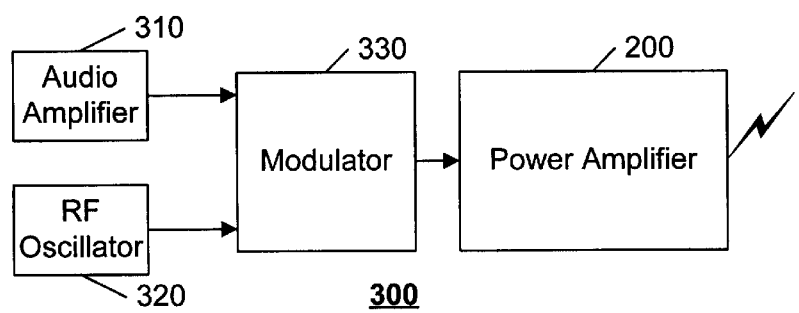
FIG. 3 illustrates an example block diagram of a wireless transmitter in accordance with this invention.

FIG. 3 illustrates an example block diagram of a wireless transmitters 300 that includes a power amplifier 200 in accordance with this invention. A modulator 330 provides the input to the power amplifier 200, by modulating the output of an audio amplifier 310 with a carrier signal from an RF oscillator 320. In this example, the load RL of FIG. 2 corresponds to an antenna that transmits the output of the power amplifier 200. To comply with existing transmission standards, and to maximize the transmission efficiency, the power amplifier 200 is designed to suppress the harmonics of the carrier signal.

Figure 4A:
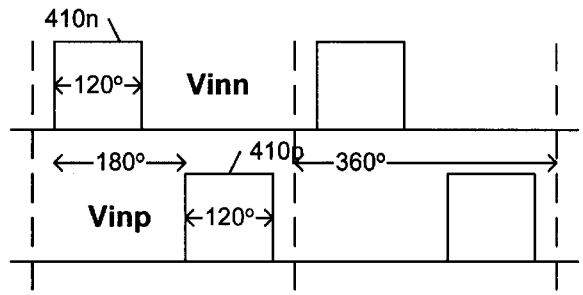
FIGS. 4A and 4B illustrate example timing diagrams associated with differential input signals in accordance with this invention.

As noted above, even-order harmonics are substantially reduced via the differential structure of the power amplifier 200. Third-order harmonics are reduced by controlling the phase relationship, and pulse duration of the input signals Vinn and Vinp, as illustrated in FIG. 4A. In a preferred embodiment, the pulse duration of each 410n, 410p of the out of phase signals Vinn and Vinp is controlled to be less than 180 degrees, and preferably to 120 degrees. For example, at each positive zero-crossing of the input signal, the splitter 220 of FIG. 2 asserts the Vinn signal for one-third of the input signal period, and, at each negative zero-crossing, the splitter 220 asserts the Vinp signal for one-third of the input signal period. The duration of one-third of the input signal period for each of the differential input signals has been found to substantially reduce the third-order harmonics, while still maintaining the second-order harmonic cancellation at the output transformer K of FIG. 2.

Optionally, because the third-order harmonics are reduced by controlling the pulse width, the output match stages Con, Lon, CLn, RL and Cop, Lop, CLp, and RL of the power amplifier 200 of FIG. 2 can be designed to further reduce, for example, fifth-order harmonics, using filter techniques common in the art.

Figure 5:
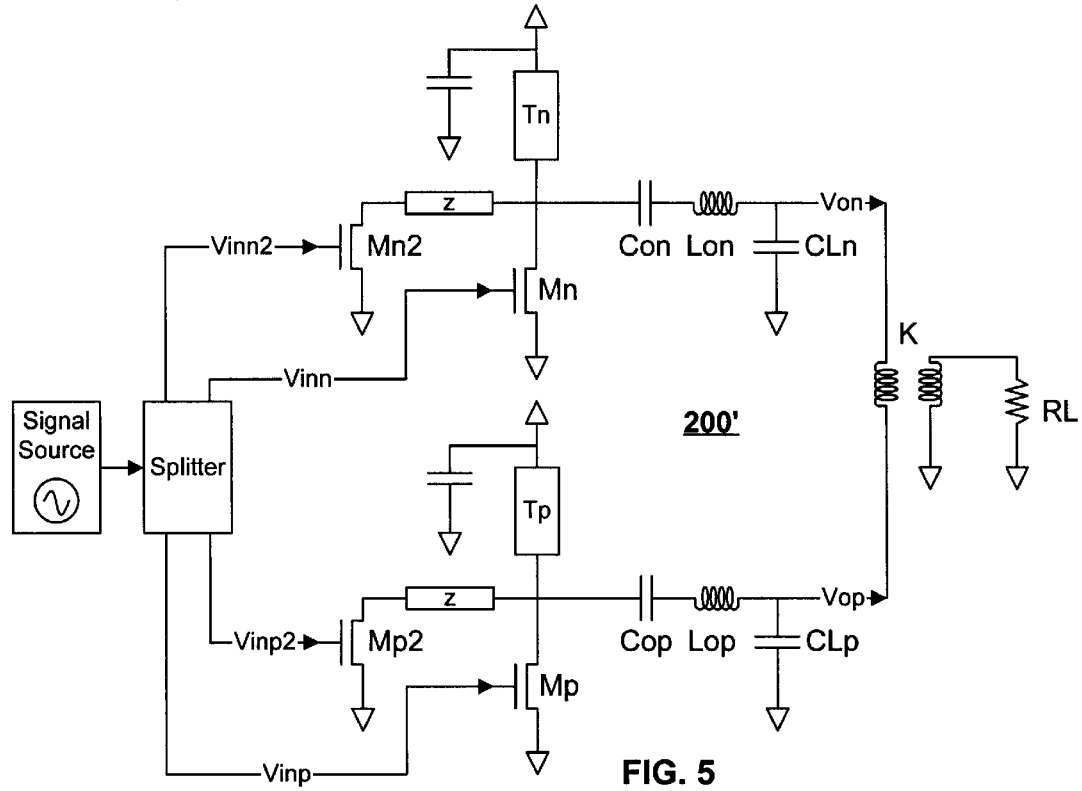
FIG. 5 illustrates an example schematic of a further enhanced CMOS Class F power amplifier in accordance with this invention.

FIG. 5 illustrates an example schematic of a further enhanced CMOS Class F power amplifier 200' in accordance with this invention. As taught in "A NEW HIGH EFFICIENCY POWER AMPLIFIER FOR MODULATED WAVES" by W. H. Doherty, in the Proceedings of the Institute of Radio Engineers, Volume 24, Number 9, published in September 1936, and incorporated by reference herein, the efficiency of a power amplifier can be improved by varying the circuit impedance over the modulation cycle. As illustrated in FIG. 5, transistors Mn2 and Mp2 are added to increase the circuit impedance at lower output power levels, to improve the efficiency performance of the power amplifier 200'.

Figure 6:
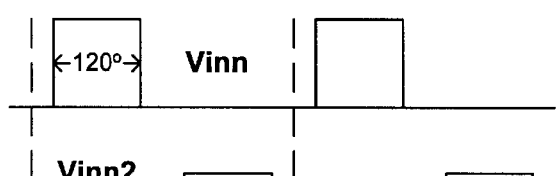
FIG. 6 illustrates an example timing diagram associated with differential and ancillary input signals for dynamically adjusting the impedance of the power amplifier of FIG. 5 in accordance with this invention.

FIG. 6 illustrates an example timing diagram associated with differential and ancillary input signals for dynamically adjusting the impedance of the power amplifier of FIG. 5 in accordance with this invention. As illustrated, the ancillary inputs Vinn2 and Vinp2 that drive the transistors Mn2 and Mp2 of FIG. 5 are out of phase with the corresponding inputs Vinn and Vinp, and at a reduced magnitude. The precise duration of the pulses on ancillary inputs Vinn2 and Vinp2 is not material; in a preferred embodiment, the durations of the pulses on the ancillary inputs Vinn2 and Vinp2 correspond to the durations of the pulses on the primary inputs Vinp and Vinn, to simplify the circuit design. The amplitudes of the ancillary inputs Vinn2 and Vinp2 are set so as to provide an increasing circuit impedance with decreasing output power levels, thereby providing a substantially constant efficiency over varying output power levels.

Figure 4B:
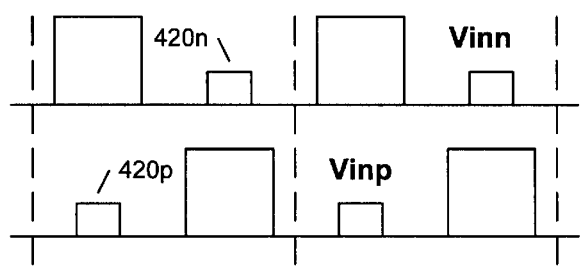

FIG. 4B illustrates an alternative means of dynamically adjusting the impedance of the circuit of FIG. 2 by applying ancillary pulses 420p and 420n to the input voltages Vinn and Vinp. Because each stage in a differential circuit typically only operates during half a cycle, the ancillary pulses 420p and 420n can be applied during the stages' traditional "off" state, so that the transistors Mp, Mn of FIG. 2 can be used in lieu of the transistors Mn2, Mp2 of FIG. 5, respectively, to adjust the impedance of the network, during their conventional "off" state.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

We claim:

1. A power amplifier, comprising:
   a first CMOS amplifier stage having an input and an output;
   a second CMOS amplifier stage having an input and an output; and
   a transformer that includes:
      a primary coil having a first and second terminal, the first terminal being operably coupled to the output of the first CMOS amplifier stage, and the second terminal being operably coupled to the output of the second CMOS amplifier stage, and
      a secondary coil that provides an output of the power amplifier;
   wherein
      the inputs of the first and the second CMOS amplifier stages correspond to differential input signals of a signal input, thereby substantially attenuating even-order harmonics of the signal input.

2. The power amplifier of claim 1, wherein
   the differential input signals are each configured to provide a pulse having a duration that is less than half a cycle period of the signal input.

3. The power amplifier of claim 2, wherein
   the duration of the pulse of each differential input is substantially equal to one-third of the cycle period of the signal input, thereby substantially attenuating a third-order harmonic of the signal input.

4. The power amplifier of claim 1, wherein
   each of the first and second CMOS amplifier stages include:
      a CMOS transistor having a gate that receives the input of the amplifier stage, and
      a match network that is operably coupled to an output of the CMOS transistor and provides the output of the amplifier stage, based on a resistance associated with a load of the power amplifier.

5. The power amplifier of claim 4, wherein
   the match network includes
      a series arrangement of a first capacitor and an inductor, operably coupled between the output of the CMOS transistor and the output of the amplifier stage, and
      a second capacitor, operably coupled between the output of the amplifier stage and a reference potential.

6. The power amplifier of claim 4, wherein
   each of the first and second CMOS amplifier stages also include
      a transmission line, operably coupled between the output of the CMOS transistor and a reference potential.

7. The power amplifier of claim 4, wherein
   the differential input signals are each configured to provide a pulse having a duration that is less than half a cycle period of the signal input.

8. The power amplifier of claim 7, wherein
the duration of the pulse of each differential input is substantially equal to one-third of the cycle period of the signal input, thereby substantially attenuating a third-order harmonic of the signal input.

9. The power amplifier of claim 8, wherein
the match network is configured to substantially attenuate a fifth-order harmonic of the signal input.

10. The power amplifier of claim 4, wherein
each of the first and second CMOS amplifier stages also include
an ancillary transistor, operably coupled to the output of the CMOS transistor, that is configured to dynamically affect an impedance associated with the amplifier stage, based on a power output level of the power amplifier.

11. The power amplifier of claim 4, wherein
each of the differential input signals includes an ancillary pulse that dynamically affects an impedance associated with the amplifier stage, based on a power output level of the power amplifier.

12. A wireless transmitter comprising:
an audio amplifier,
an RF oscillator,
a modulator, operably coupled to the audio amplifier and the RF oscillator, that is configured to provide a modulated carrier signal, and
a power amplifier, operably coupled to the modulator, that is configured to receive the modulated carrier signal and to produce an amplified output signal;
wherein
the power amplifier includes:
  a splitter that provides a first differential signal and a second differential signal, based on the modulated carrier signal,
  a first CMOS amplifier stage that receives the first differential signal and provides a first differential output;
  a second CMOS amplifier stage that receives the second differential signal and provides a second differential output;
  a transformer that includes:
    a primary coil having a first and second terminal, the first terminal being operably coupled to the first differential output, and the second terminal being operably coupled to the second differential output, and
    a secondary coil that provides the amplified output signal.

13. The wireless transmitter of claim 12, wherein
the splitter is configured to provide the first and second differential signals as pulses, each having a duration that is less than half a cycle period of the modulated carrier signal.

14. The wireless transmitter of claim 13, wherein
the duration of each pulse is substantially equal to one-third of the cycle period of the modulated carrier signal.

15. The wireless transmitter of claim 12, wherein
each of the first and second CMOS amplifier stages include:
  a CMOS transistor having a gate that receives the differential signal of the amplifier stage, and
  a match network that is operably coupled to an output of the CMOS transistor and provides the differential output, based on a resistance associated with an output load of the power amplifier.

16. The wireless transmitter of claim 15, wherein
the splitter is configured to provide the first and second differential signals as pulses, each having a duration that is less than half a cycle period of the modulated carrier signal.

17. The wireless transmitter of claim 16, wherein
the duration of each pulse is substantially equal to one-third of the cycle period of the modulated carrier signal.

18. The wireless transmitter of claim 15, wherein
each of the first and second CMOS amplifier stages also include
an ancillary transistor, operably coupled to the output of the CMOS transistor, that is configured to dynamically affect an impedance associated with the amplifier stage, based on a power output level of the power amplifier.

19. The wireless transmitter of claim 12, wherein
the splitter is further configured to provide ancillary pulses to each of the differential signals, to dynamically affect an impedance associated with the amplifier stage, based on a power output level of the power amplifier.

* * * * *